(12) United States Patent
Zhu et al.

(10) Patent No.: US 8,679,937 B2
(45) Date of Patent: Mar. 25, 2014

(54) METHOD FOR FABRICATING A CAPACITOR AND CAPACITOR STRUCTURE THEREOF

(75) Inventors: Yefang Zhu, Shanghai (CN); Liangliang Guo, Shanghai (CN); Herb Huang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 263 days.

(21) Appl. No.: 13/235,181

(22) Filed: Sep. 16, 2011

(65) Prior Publication Data
US 2012/0168902 A1    Jul. 5, 2012

(30) Foreign Application Priority Data
Dec. 31, 2010 (CN) .......................... 2010 1 0620994

(51) Int. Cl.
*H01L 21/20* (2006.01)
(52) U.S. Cl.
USPC ..... 438/386; 257/535; 257/532; 257/E21.008
(58) Field of Classification Search
CPC .......... H01L 28/60; H01L 28/90; H01L 28/40
USPC .......... 438/243, 386; 257/516, 528, 535, 532, 257/E21.008, E29.343
See application file for complete search history.

(56) References Cited

FOREIGN PATENT DOCUMENTS

CN    101840912 A    9/2010

*Primary Examiner* — Yu-Hsi D Sun
(74) *Attorney, Agent, or Firm* — Anova Law Group, PLLC

(57) ABSTRACT

A method for fabricating a capacitor includes providing a substrate having a first surface and a second surface, and forming a plurality of openings in the substrate, the openings are separated from each other by a shape of the substrate, each opening having sidewalls and a bottom. The method further includes submitting the substrate including the openings to an oxidation process to form an oxide layer covering the sidewalls and the bottom of the openings, and a portion of a surface of the substrate, wherein a shape of the substrate disposed between a pair of two adjacent openings is completely oxidized to form an insulation layer between the pair of two adjacent openings; and depositing a conductive material layer over the oxide layer in the openings such that the conductive material layer is electrically continuous and such that the pair of adjacent openings form a capacitor.

11 Claims, 3 Drawing Sheets

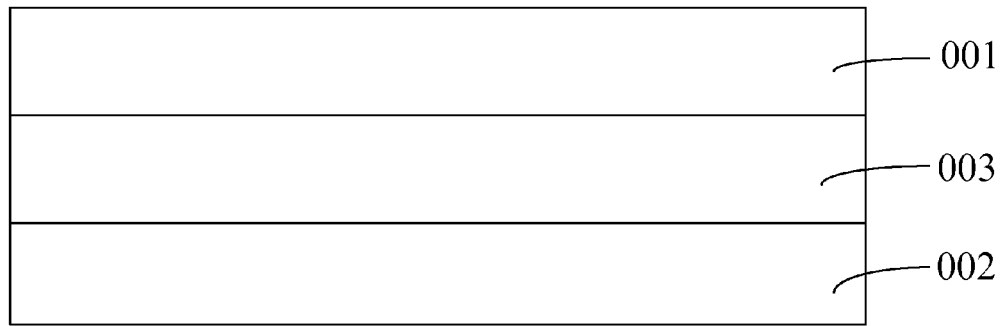
FIG. 1 *(Prior Art)*
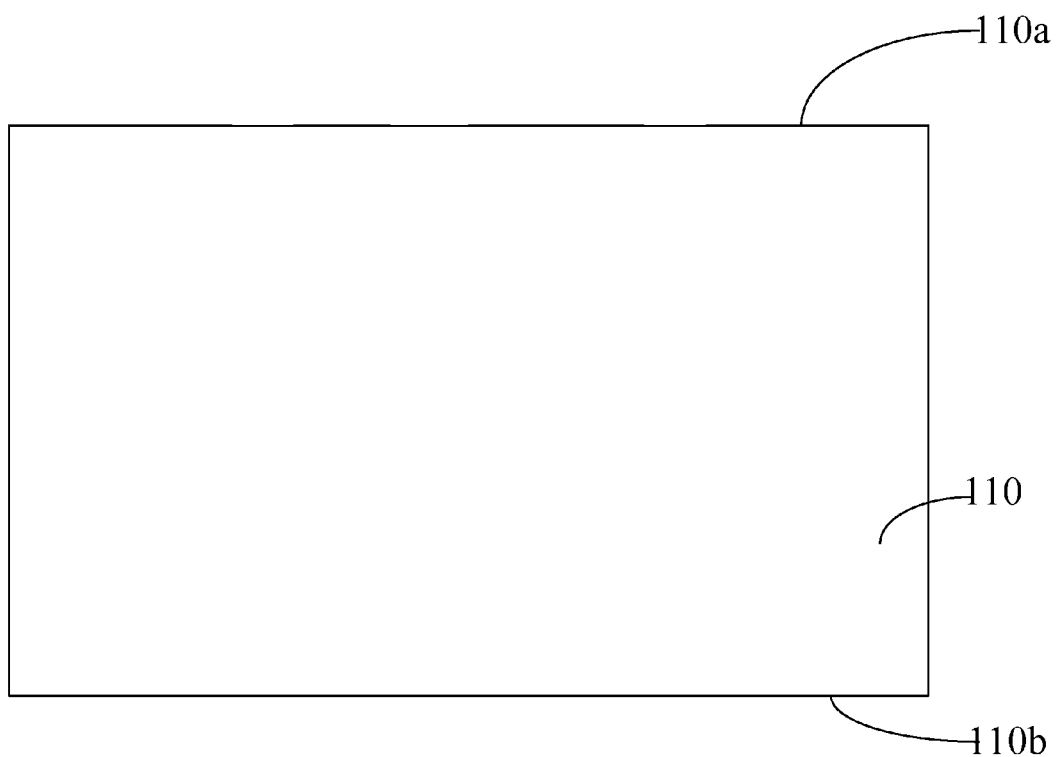
FIG. 2

METHOD FOR FABRICATING A CAPACITOR AND CAPACITOR STRUCTURE THEREOF

CROSS-REFERENCES TO RELATED APPLICATIONS

This application claims priority under 35 USC §119 of Chinese Patent Application No. 201010620994.9, filed on Dec. 31, 2010, commonly assigned and incorporated herein by reference in its entirety.

BACKGROUND OF THE INVENTION

1. Field of the Invention

Embodiments of the present invention relate to semiconductor technology, and more particularly, to a method for fabricating a capacitor and a capacitor structure thereof.

2. Description of Prior Art

One technique for vertically interconnecting chips is through silicon vias (TSV). Through silicon vias are connections through the substrate of the chips and may be used to connect a layer of chips on one side of the substrate to an opposite side of the substrate. Different from IC wire-bonding and stud-bump bonding technology, the TSV technique maximizes the density of stacked chips in three dimensional directions, minimizes overall area, and significantly improves the chip interconnect speed and power consumption performance.

A method for forming a TSV is via first technology, wherein before fabricating metal layers of a semiconductor chip, a via is formed through a chip substrate, and the via is electrically connected with a metal layer near the substrate of the chip; then, feedthrough connections are added for obtaining a low resistive path to active components on the substrate. In other words, multiple through-silicon vias can be fabricated to provide electric power to another chip.

Another method for forming TSV is via last technology. In the via last technology, a metal layer is first formed on the substrate of the chip; then a TSV is formed through the substrate and metal layers. The via last method allows a straight line path through the semiconductor chip, so that there is no need for additional metal layers.

In conventional art, regardless how a TSV is formed, either through via first technology or via last technology, at least an interconnect capacitor should be fabricated in the substrate as decoupling capacitor. Generally, the interconnect capacitor is a parallel-plate capacitor. Specifically, the parallel-plate capacitor is fabricated by successively forming a metal layer, an insulator layer, and a metal layer on the substrate, which forms an interconnect capacitor. However, this conventional metal-insulation-metal (MIM) capacitor requires substantial silicon area for large capacitance values.

Therefore, there is a need for a method of fabricating interconnect capacitor between chips that can use silicon area more efficiently to provide a high capacitance value.

BRIEF SUMMARY OF THE INVENTION

Embodiments of the present invention provide a method for fabricating a capacitor and a capacitor structure thereof that increases the value of interconnection capacitance using vertical conductors between chips. The method includes providing a substrate having a plurality of openings, the openings are separated from each other by a shape of the substrate, each opening having sidewalls and a bottom, submitting the substrate including the openings to an oxidation process to form an oxide layer covering the sidewalls and the bottom of the openings, and a portion of a surface of the substrate, wherein a shape of the substrate disposed between a pair of two adjacent openings is completely oxidized to form an insulation layer between the pair of two adjacent openings; and depositing a conductive material layer over the oxide layer in the openings such that the conductive material layer is electrically continuous and such that the pair of adjacent openings form a vertical capacitor.

In one embodiment, the method further includes removing a portion of an opposite surface of the substrate to expose the bottom of the openings.

Optionally, the openings comprise a height (or a depth) ranging from 200 µm to 300 µm.

Optionally, the substrate has a thickness ranging from 200 µm to 800 µm.

Optionally, the pair of adjacent openings forming the vertical capacitor have a height ranging from 200 µm to 800 µm.

Optionally, the oxidation process comprises a thermal oxidation process.

Optionally, the conductive material layer covering the oxide layer in the openings have a surface area ranging from 10 µm×200 µm to 30 µm×800 µm.

Optionally, the conductive material layer comprises copper or aluminum.

Optionally, the openings having shapes of substrate disposed between them that are not completely oxidized may include interconnect vias.

Optionally, depositing a conductive material layer comprises electroplating.

Embodiments of the present invention provide a capacitor structure that includes a substrate having a first surface and a second surface, first and second vias in the substrate, each via includes sidewalls, and an insulation layer covering the sidewalls and a portion of the first surface of the substrate. The capacitor structure further includes a conductive material layer that fills an inside surface of the insulation layer to form an electrically continuous conductive path having a first end and a second end, wherein the first end flushes with a surface of the insulation layer over the portion of the first surface of the substrate and the second end flushes with the second surface of the substrate.

Optionally, the conductive path has a length ranging from 200 µm to 800 µm.

Optionally, the substrate has a thickness ranging from 200 µm to 800 µm.

Optionally, the conductive path has a surface area ranging from 10 µm×200 µm to 30 µm×800 µm.

Embodiments of the present invention provide many advantages over the prior art. In an embodiment, by fabricating capacitor vias in the substrate and filling a conductive material in the capacitor vias, an interconnect capacitor can be vertically formed in the substrate. The maximal depth of the capacitor via may equal the thickness of the substrate, thus the area of the conductive material is correlated to the thickness of the substrate, thus, a vertical capacitor structure with high capacitance values and with significant saving in die area can be obtained.

Furthermore, the interconnection via and capacitor vias can be formed through one etching process, so that the interconnection via and the capacitor vias can be fabricated simultaneously, and the number of the process steps does not increase.

Additionally, the process of fabricating a capacitor is compatible with the process of forming the interconnection metal plug, which can be formed simultaneously, so that the process is further simplified and the manufacturing cost is reduced.

BRIEF DESCRIPTION OF THE DRAWINGS

The accompanying drawings, which are incorporated herein and form a part of the specification, and together with the description, further explain embodiments of the invention and enable a person skilled in the art to make and use the invention. It is noted that the drawings are provided for illustrative purposes only and, as such they are not drawn to scale.

FIG. 1 shows a conventional structure diagram of a parallel-plate capacitor; and FIG. 2 to FIG. 6 are cross-sectional views of a semiconductor substrate showing various stages of forming a capacitor according to an embodiment of the present invention.

DETAILED DESCRIPTION OF THE INVENTION

Figure 3:
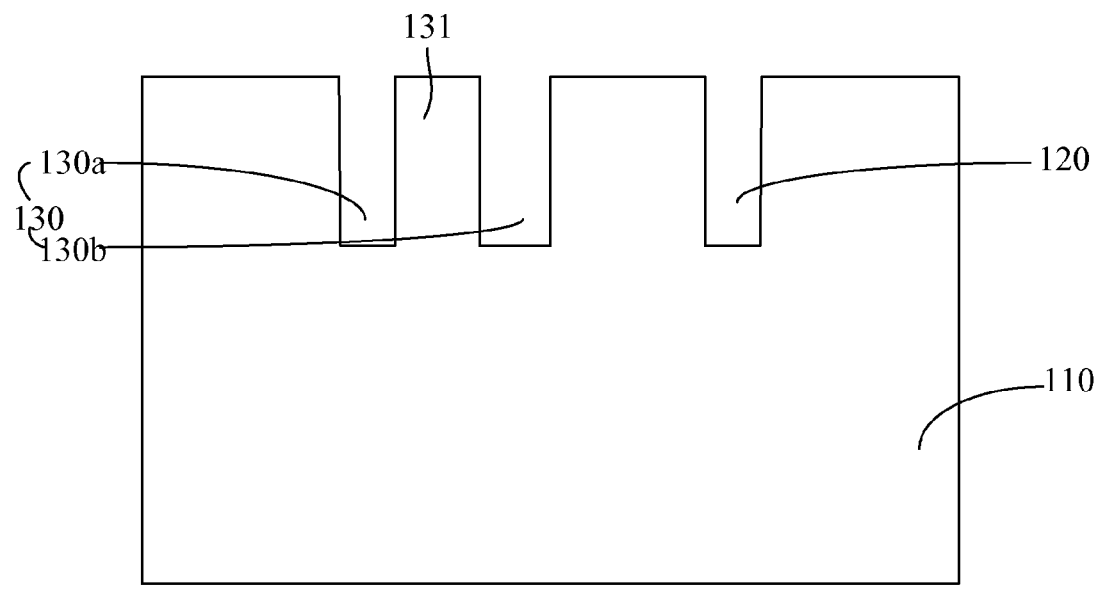

In the conventional art, when a TSV is formed, either through via first technology or via last technology, it is desired to form an interconnect capacitor in the substrate. The interconnect capacitor is generally a parallel-plate capacitor. Specifically, the parallel-plate capacitor is fabricated by forming successively a metal layer over an insulator layer over a metal layer on the substrate.

As shown in FIG. 1, a horizontal parallel-plate capacitor includes a first plate 001 and a second plate 002 separated by a dielectric layer 003.

To increase the capacitance of the parallel-plate capacitor, the surface area of the first and second plates needs to be increased. Because the area of a semiconductor substrate is limited, the horizontal parallel-plate capacitor is not a preferred solution, as the surface areas of the plates range from 10 μm×10 μm to 20 μm×20 μm.

To increase the capacitance of the interconnect capacitor having plates vertically connecting stacked chips, embodiments of the present invention provide a method for fabricating a capacitor. The method includes providing a substrate having a first surface and a second surface, forming a plurality of openings in the substrates, the openings are separated from each other by a shape of the substrate, each opening has sidewalls and a bottom, submitting the substrate including the openings to an oxidation process to form an oxide layer covering the sidewalls and the bottom of the openings, a portion of the first surface of the substrate, wherein a shape of the substrate disposed between two adjacent openings is completely oxidized for insulating the two adjacent openings, depositing a conductive material layer covering the oxide layer in the openings so that the two adjacent openings form a capacitor.

According to the present invention, a method for fabricating an interconnect capacitor is provided. The method includes the steps of forming interconnection vias and capacitor vias in the substrate, and filling metal plugs in the interconnection vias and the capacitor vias. An interconnect capacitor is thus vertically formed for connecting chips that are stacked. As the capacitor is formed using capacitor vias, its electrodes or plates can have a length equal to the thickness of the substrate, thus the surface area of the plates can be significantly increased in the vertical direction relative to the surface of the substrate, and a high capacitance value of the interconnect capacitor can be obtained.

As shown in FIG. 2, a substrate 110 having a first surface 110a and a second surface 110b is provided. Active components and metal layers (not shown in the figure) are formed on the first surface 110a, but not formed on the second surface 110b. The substrate 110 can be made of silicon, Silicon-Germanium (SiGe), Silicon-On-Insulator (SOI), other materials such as gallium arsenide, or other III-V group compounds. In an embodiment, the substrate 110 is made of silicon and has a thickness ranging from 200 μm to 800 μm.

As shown in FIG. 3, the substrate 110 is etched by patterning. A pattern is defined on the substrate using photoresist. Areas of the substrate that are not covered by photoresist will be etched. Wet or dry etching techniques can be used. The photoresist is then removed from the substrate. Through photoresist patterning and etching, a plurality of openings can be formed in the substrate. The openings can have any form that is determined by the photoresist pattern. For the sake of clarity, only three openings are shown: an interconnection via 120 and a pair of adjacent capacitor vias 130a, 130b. The capacitor vias 130a and 130b are separated by a shape 131 of the substrate. Each of the interconnect via, capacitor vias has sidewalls and a bottom. In an embodiment, the sidewalls are straight parallel to each other and extend vertically to the surface 110b of the substrate. In another embodiment, the sidewalls can have a curved surface that extend vertically to the surface 110b of the substrate.

In an embodiment, the interconnection via 120 has a depth or height ranging from 200 μm to 300 μm, and the pair of capacitor vias 130 has a depth (height) ranging from 200 μm to 800 μm. The term depth or height may be used alternatively hereinafter. The depth of the interconnect via or capacitor via or opening is used when it is measured in relation to the first surface of the substrate. The height of the interconnect via, capacitor via, or opening is used when it is measured in relation to the bottom of the via or opening. The term opening, interconnect via, or capacitor vias will be used alternatively hereinafter. An opening has parallel sidewalls and a bottom and can have many forms such as a straight trench or a cylindric curved trench.

In an embodiment, the pair of capacitor vias has a depth that is substantially equal to the depth of the interconnection via 120. In other embodiments, the depth of the pair of capacitor vias 130 may be different from the depth of the interconnection via 120. In an example embodiment, the depth of the capacitor vias 130 may be greater or smaller than the depth of the interconnection via 120, and the depths of the capacitor vias 130 and the interconnection via 120 can be controlled by adjusting and selecting appropriate etching parameters.

The interconnection via 120 and the capacitor vias 130 can be formed in one etching process. In an embodiment, patterning for the substrate 110 can be implemented by firstly providing a reticle mask having a pattern of the interconnection via 120 thereon; forming a pattern of the capacitor vias on the reticle mask; and patterning the substrate 110 by using the reticle mask which has the pattern of the interconnection via 120 and pattern of the capacitor vias as a mask.

In other embodiments, patterning the substrate 110 can be performed by firstly forming the interconnection via using a reticle mask with the pattern of the interconnection via as a mask, and then forming the capacitor vias using another reticle mask with the pattern of the capacitor vias as a mask.

Alternatively, patterning the substrate 110 can be performed by firstly forming the capacitor vias using a reticle mask with the pattern of the capacitor vias as a mask; then forming the interconnection via using a reticle mask with the pattern of the interconnection via as a mask.

Optionally, in order to fabricate the interconnection via and the capacitor vias using a single reticle mask, the pattern of the capacitor vias is added to the reticle mask with the pattern of the interconnection via, which simplifies the process and reduces the manufacturing cost.

Figure 4:
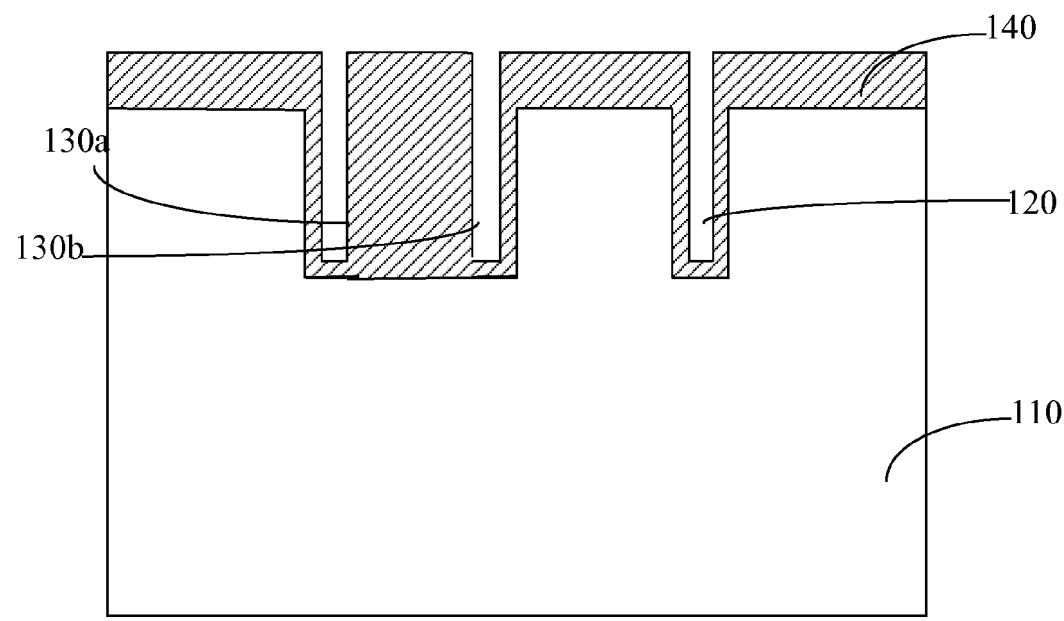

As shown in FIG. 4, an oxidized layer 140 is formed on the sidewalls and the bottom of the interconnection via 120, of the first capacitor via 130a, of the second capacitor via 130b, and a portion of the first surface of the substrate 110. In a specific embodiment, the layer 140 is formed by a thermal oxidation process.

Referring to FIG. 4, the silicon at both sides of the first capacitor via 130a and the second capacitor via 130b are oxidized simultaneously, which causes the silicon (shape 131) between the first capacitor via 130a and the second capacitor via 130b to be completely oxidized, and becomes silicon oxide. In other words, the first capacitor via 130a and the second capacitor via 130b are insulated by the silicon oxide.

Figure 5:
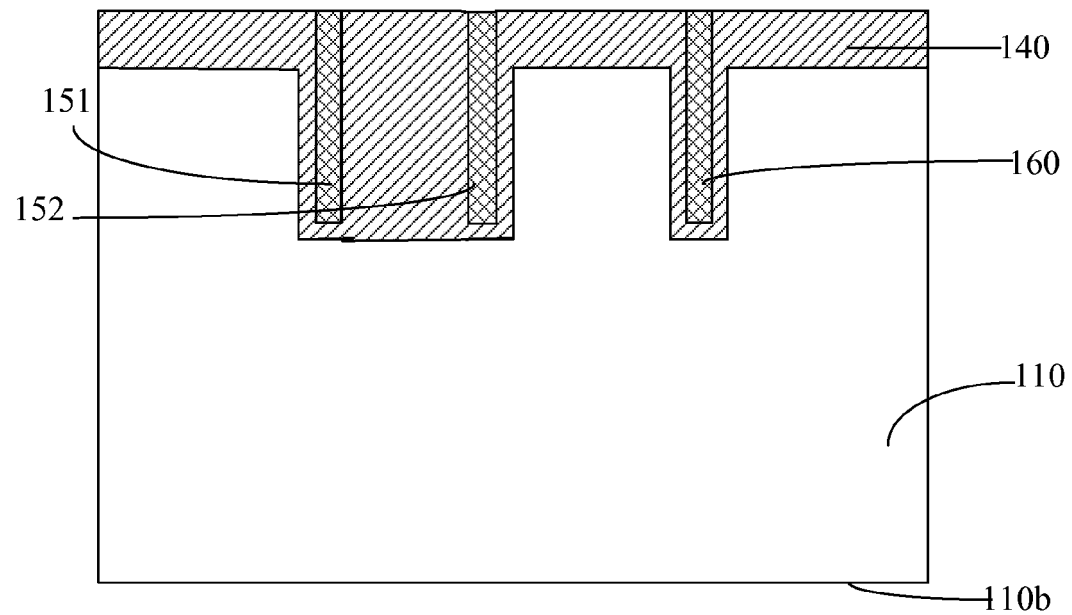

As shown in FIG. 5, an interconnection metal plug 160 is formed by filling a conductive material in the interconnection via 120 that is covered by oxidized layer 140. A first polarity plate 151 and a second polarity plate 152 are formed by the conductive material that fills the first capacitor via 130a and the second capacitor via 130b. The first polarity plate 151, the second polarity plate 152, and the oxidized layer 140 constitute a capacitor. In an embodiment, the conductive material may include copper or aluminum.

Figure 6:
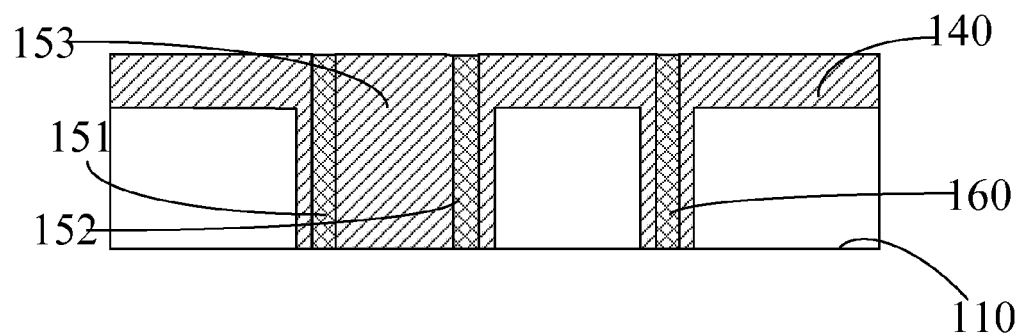

In an embodiment, the depth of the capacitor vias 130 ranges from 200 μm to 800 μm, so that the length of the plates can be substantially the same as the depth of the capacitor vias 130 (i.e., from 200 μm to 800 μm), while the width of the plates depends on the size of the first surface 110a of the substrate. In an embodiment, the width of the plates ranges from 10 μm to 30 μm. Thus, the area of the polarity plates ranges from 10 μm×200 μm to 30 μm×800 μm, which is much larger than the area of polarity plate of a parallel-plate capacitor fabricated by the prior art. As shown in FIG. 6, by polishing a portion of the substrate 110 along the second surface 110b, the interconnection metal plug 160 and a bottom of the capacitor are exposed to form vertical conducting paths between chips.

Further referring to FIG. 6, in an embodiment, the depth of the capacitor and the depth of the interconnection metal plug are substantially the same. In other embodiments, the depth of the capacitor and the interconnection metal plug may be different. In an example embodiment, if the depth of the capacitor via is greater than the depth of the interconnection metal plug, the ends of the capacitor and the interconnection metal plug need to be polished until the bottom of the capacitor and interconnection metal plugs are exposed.

Embodiments of the present invention further provide a capacitor structure. The capacitor structure includes a silicon substrate having a first surface and a second surface, a first capacitor via and a second capacitor via, each of the capacitor vias has sidewalls, an insulation layer covering the sidewalls and a portion of the first surface of the substrate, and a conductive material filling a space of the insulating layer to form a conductive path. In an embodiment, the insulation layer includes a silicon oxide that is formed by a thermal oxidation process. In an embodiment, the conductive path includes a first end and a second end, wherein the first end flushes with a surface of the insulation layer, which covers the portion of the first surface, and the second end flushes with the second surface of the substrate. In an embodiment, the conductive path may have a rectangular shape forming a plate. In an embodiment, the plate has a length ranging from 200 μm to 800 μm.

Optionally, the substrate has a thickness ranging from 200 μm to 800 μm, and the area of the polarity plates may range from 10 μm×200 μm to 30 μm×800 μm.

Embodiments of the present invention provide advantages over conventional art. For example, by forming the capacitor vias 130 in the substrate 110, and filling the capacitor vias 130 with a conductive material, an interconnect capacitor is formed vertically that can be used as a decoupling capacitor for the same chip or between chips. The length of the capacitor via 130 may have the thickness of the substrate 110, thus, the area of polarity plates can be significantly increased, and a high capacitance value of the interconnect capacitor can be obtained.

Furthermore, the interconnection via 120 and the capacitor vias 130 can be formed through one etching process step, so that the interconnection via 120 and the capacitor vias 130 can be formed simultaneously.

Furthermore, because the pattern of the capacitor vias 130 is added to an existing reticle mask having the pattern of the interconnection via 120, no additional reticle mask is used, so that the process can be simplified and the cost can be reduced.

Additionally, the process for fabricating the interconnect capacitor is compatible with the process of the interconnection metal plug formation, so that they can be performed simultaneously, that further simplifies the manufacturing process and reduces costs.

Although a specific embodiment of the present invention has been disclosed, it will be obvious to those skilled in the art that various modification and alternations may be made without departing from the spirit and scope of the present invention. For example, in the embodiment described in FIG. 3, the first capacitor via 130a and the second capacitor via 130b are parallel-plates. In other embodiments not shown, the first capacitor via can be a column and the second capacitor can be a cylinder surrounding the first capacitor via. Accordingly, the scope of the present invention shall be defined in the appended claims.

What is claimed is:

1. A method for fabricating a capacitor, the method comprising:
providing a substrate having a first surface and a second surface;
forming a plurality of openings in the substrate, the openings being separated from each other by a shape of the substrate, each opening having sidewalls and a bottom;
submitting the substrate to an oxidation process to form an oxide layer covering the sidewalls and the bottom of the each opening to form a via structure, and covering a portion of the first surface of the substrate, wherein the shape of the substrate disposed between two adjacent openings is totally oxidized for insulating two adjacent via structures; and
depositing a conductive material layer in the openings, wherein the two adjacent openings form a capacitor.

2. The method of claim 1 further comprising:
removing a portion of the second surface of the substrate to expose a bottom of the via structures.

3. The method of claim 1, further comprising interconnection vias that are formed from the openings having shapes of the substrate disposed therebetween that are partially oxidized or not oxidized.

4. The method of claim 1, wherein the openings comprise a height ranging from 200 μm to 300 μm.

5. The method of claim 1, wherein the substrate comprises a thickness ranging from 200 μm to 800 μm.

6. The method of claim 1, wherein the two adjacent openings comprise a height ranging from 200 μm to 800 μm.

7. The method of claim 1, wherein the oxidation process comprises a thermal oxidation process.

8. The method of claim 1, wherein the conductive material contained in the via structures comprises a rectangular shape ranging from 10 μm×200 μm to 30 μm×800 μm.

9. The method of claim 1, wherein the conductive material layer comprises copper or aluminum.

10. The method of claim 1, wherein the openings having shapes of substrate disposed therebetween that are not completely oxidized comprise interconnect vias.

11. The method of claim 1, wherein depositing a conductive material layer comprises electroplating.

* * * * *